United States Patent
Aritome

(10) Patent No.: US 8,610,194 B2
(45) Date of Patent: *Dec. 17, 2013

(54) SEMICONDUCTOR DEVICE WITH VERTICAL GATE AND METHOD FOR FABRICATING THE SAME

(75) Inventor: Seiichi Aritome, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 503 days.

This patent is subject to a terminal disclaimer.

(21) Appl. No.: 12/832,105

(22) Filed: Jul. 8, 2010

(65) Prior Publication Data

US 2011/0032772 A1 Feb. 10, 2011

(30) Foreign Application Priority Data

Aug. 7, 2009 (KR) .................. 10-2009-0073023

(51) Int. Cl.
*H01L 29/788* (2006.01)

(52) U.S. Cl.
USPC .......... 257/315; 257/314; 257/316; 257/E29.3

(58) Field of Classification Search
USPC ................. 365/185.01, 185.28, 185.29; 257/314–316, 324, E29.3, E29.309
See application file for complete search history.

(56) References Cited

U.S. PATENT DOCUMENTS

| 7,298,006 | B2 | 11/2007 | Arai et al. | |
|---|---|---|---|---|
| 2009/0310425 | A1* | 12/2009 | Sim et al. | 365/185.29 |
| 2010/0181612 | A1* | 7/2010 | Kito et al. | 257/319 |
| 2012/0213009 | A1* | 8/2012 | Aritome et al. | 365/185.29 |

FOREIGN PATENT DOCUMENTS

| KR | 1020080058251 | 6/2008 |
|---|---|---|
| KR | 1020080096734 | 11/2008 |
| KR | 1020090034776 | 4/2009 |
| KR | 1020090038412 | 4/2009 |

OTHER PUBLICATIONS

Notice of Allowance issued from Korean Intellectual Property Office on May 31, 2011.

* cited by examiner

*Primary Examiner* — Allison P Bernstein
(74) *Attorney, Agent, or Firm* — IP & T Group LLP

(57) ABSTRACT

A vertical channel type non-volatile memory device having a plurality of memory cells stacked along a channel includes the channel configured to be protruded from a substrate, a tunnel insulation layer configured to surround the channel, a plurality of floating gate electrodes and a plurality of control gate electrodes configured to be alternately stacked along the channel, and a charge blocking layer interposed between the plurality of the floating gate electrodes and the plurality of the control gate electrodes alternately stacked.

6 Claims, 14 Drawing Sheets

SEMICONDUCTOR DEVICE WITH VERTICAL GATE AND METHOD FOR FABRICATING THE SAME

CROSS-REFERENCE TO RELATED APPLICATIONS

The present application claims priority of Korean Patent Application No. 10-2009-0073023, filed on Aug. 7, 2009, which is incorporated herein by reference in its entirety.

BACKGROUND OF THE INVENTION

Exemplary embodiments of the present invention relate to a semiconductor device and a fabrication method thereof, and more particularly, to a vertical channel type non-volatile memory device and a fabrication method thereof.

A non-volatile memory device maintains data stored therein although a power supply is cut off. As the current technology is reaching its limits in improving the integration degree of a memory device having a two-dimensional structure where a memory device is fabricated in a single layer over a silicon substrate, a non-volatile memory device having a three-dimensional structure where memory cells are stacked vertically over a silicon substrate is being developed.

Hereafter, a method for fabricating a typical non-volatile memory device having a three-dimensional structure and problems thereof will be described in detail with reference to the accompanying drawings.

FIG. 1 is a cross-sectional view illustrating a structure of a conventional vertical channel type non-volatile memory device.

Referring to FIG. 1, a lower selection transistor LST, a plurality of memory cells MC and an upper selection transistor UST are sequentially formed over a substrate 10 with a source region S formed therein.

First, a plurality of interlayer dielectric layers 11 and a plurality of conductive layers 12 for a gate electrode are formed over a substrate with a source region S formed therein, and trenches TRENCH exposing the surface of the substrate 10 are formed by etching the plurality of the interlayer dielectric layers 11 and the plurality of the conductive layers 12 for a gate electrode. Subsequently, a gate insulation layer 13 is formed on the internal wall of the trenches TRENCH. Subsequently, the trenches TRENCH are filled with a layer for a channel to thereby form channels CH. In this way, the lower selection transistor LST is formed.

Subsequently, a plurality of interlayer dielectric layers 11 and a plurality of conductive layers 12 for a gate electrode are formed over a substrate 10 with a lower selection transistor LST formed thereon, and trenches TRENCH exposing the surface of the channel of the lower selection transistor LST are formed by etching the plurality of the interlayer dielectric layers 11 and the plurality of the conductive layers 12 for a gate electrode. Subsequently, a charge blocking layer, a charge tapping layer, and a tunnel insulation layer (together labeled as "14") are sequentially formed on the internal wall of the trenches. Herein, the charge trapping layer is used as a sort of a data storage for storing/erasing data by trapping/discharging charges. Generally, a nitride layer is used as the charge trapping layer. Subsequently, the trenches TRENCH are filled with a layer for a channel to thereby form channels CH. In this way, a plurality of memory cells MC are formed to be stacked along the channels protruded from the substrate 10.

Subsequently, a plurality of interlayer dielectric layers 11 and a plurality of conductive layers 12 for a gate electrode are formed over a substrate 10 with a plurality of memory cells MC formed thereon, and trenches TRENCH exposing the surface of the channel CH of the memory cell MC are formed by etching the plurality of the interlayer dielectric layers 11 and the plurality of the conductive layers 12 for a gate electrode. Subsequently, a gate insulation layer 13 is formed on the internal wall of the trenches TRENCH. Subsequently, the trenches TRENCH are filled with a layer for a channel to thereby form channels CH. In this way, the upper selection transistor UST is formed.

Herein, the plurality of the memory cells MC are coupled in series between the lower selection transistor LST and the upper selection transistor UST to thereby form a string ST and each of the channels CH is connected to a bit line BL.

According to the conventional technology described above, each of the memory cells MC may constitute a charge-trapping non-volatile memory device having a three-dimensional structure which includes a charge trapping layer for trapping charges. However, the charge-trapping non-volatile memory device has a drawback in that its characteristics are poorer than those of a floating gate type non-volatile memory device.

Specifically, the charge-trapping non-volatile memory device has a slower program/erase operation speed and poorer data retaining characteristics than the floating gate type non-volatile memory device. In particular, since the non-volatile memory device having a three-dimensional structure has the charge trapping layers of the plurality of the memory cells MC, which are stacked along the channels CH and are coupled with each other, the data retaining characteristics are deteriorated even more.

Therefore, in order to improve the performance of a memory device and raise reliability, it is required to develop a floating gate type non-volatile memory device that has a three-dimensional structure and a fabrication method thereof.

SUMMARY OF THE INVENTION

An exemplary embodiment of the present invention designed to resolve the aforementioned problems, is directed to a floating gate type non-volatile memory device that has a three-dimensional structure which includes a floating gate electrode and first and second control gate electrodes formed in the upper and lower portions of the floating gate electrode, respectively, and a method for fabricating the floating gate type non-volatile memory device having a three-dimensional structure.

In accordance with another exemplary embodiment of the present invention, a vertical channel type non-volatile memory device having a plurality of memory cells stacked along a channel includes: the channel configured to be protruded from a substrate; a tunnel insulation layer configured to surround the channel; a plurality of floating gate electrodes and a plurality of control gate electrodes configured to be alternately stacked along the channel; and a charge blocking layer interposed between the plurality of the floating gate electrodes and the plurality of the control gate electrodes, wherein the plurality of the floating gate electrodes are alternately stacked with the plurality of the control gate electrodes.

In accordance with another exemplary embodiment of the present invention, a method for fabricating a vertical channel type non-volatile memory device includes: alternately forming a plurality of interlayer dielectric layers and a plurality of sacrificial layers over a substrate; forming trenches by etching the plurality of the interlayer dielectric layers and the plurality of the sacrificial layers; recessing the plurality of the interlayer dielectric layers exposed through an internal wall of the trenches by a predetermined depth to thereby form recess regions; forming floating gate electrodes by filling the recess regions with a conductive layer; forming a channel by filling the trenches with a layer for a channel; removing the plurality of the sacrificial layers; forming a charge blocking layer surrounding the floating gate electrodes exposed due to the removal of the plurality of the sacrificial layers; and forming control gate electrodes adjacent to upper and lower portions of each floating gate electrode by filling a conductive layer in opened regions around the charge blocking layer.

In accordance with another exemplary embodiment of the present invention, a method for fabricating a vertical channel type non-volatile memory device includes: alternately forming a plurality of interlayer dielectric layers and a plurality of conductive layers for a control gate electrode over a substrate; forming trenches to expose a surface of the substrate by etching the plurality of the interlayer dielectric layers and the plurality of the conductive layers for a control gate electrode; recessing the plurality of the interlayer dielectric layers exposed through an internal wall of the trenches by a predetermined depth to thereby form recess regions; forming a charge blocking layer over the resultant structure with the recess regions; forming floating gate electrodes adjacent to upper and lower portions of a control gate electrode by filling a conductive layer in opened regions around the charge blocking layer; and forming a channel by filling the trenches with a layer for a channel.

DETAILED DESCRIPTION OF EXEMPLARY EMBODIMENTS OF THE INVENTION

Figure 1:
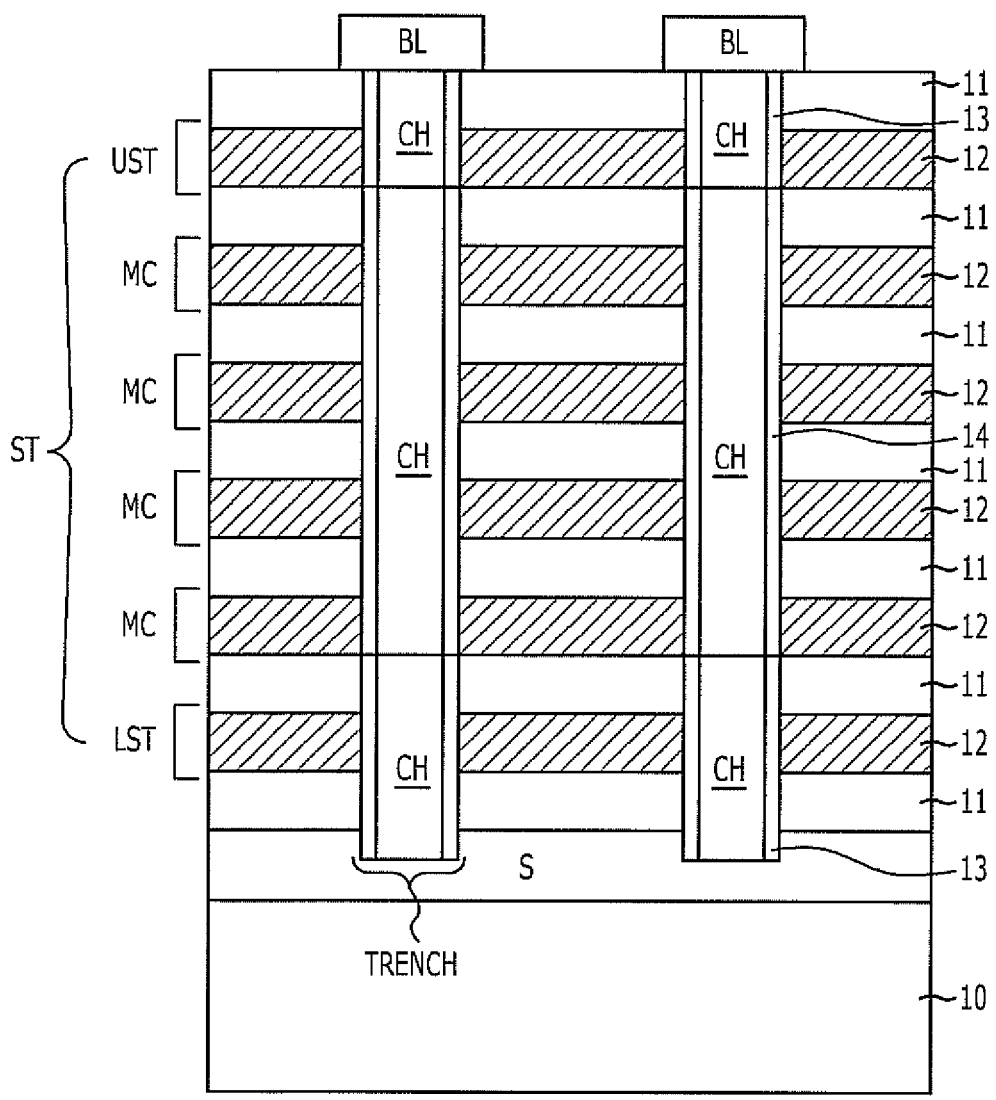
FIG. 1 is a cross-sectional view illustrating a structure of a conventional vertical channel type non-volatile memory device.

Exemplary embodiments of the present invention will be described below in more detail with reference to the accompanying drawings. The present invention may, however, be embodied in different forms and should not be constructed as limited to the exemplary embodiments set forth herein. Rather, these exemplary embodiments are provided so that this disclosure will be thorough and complete, and will fully convey the scope of the present invention to those skilled in the art. Throughout the disclosure, like reference numerals refer to like parts throughout the various figures and exemplary embodiments of the prevent invention.

The drawings are not necessarily to scale and in some instances, proportions may have been exaggerated in order to clearly illustrate features of the exemplary embodiments. When a first layer is referred to as being "on" a second layer or "on" a substrate, it not only refers to a case where the first layer is formed directly on the second layer or the substrate but also a case where at least a third layer exists between the first layer and the second layer or the substrate.

Figure 2A:
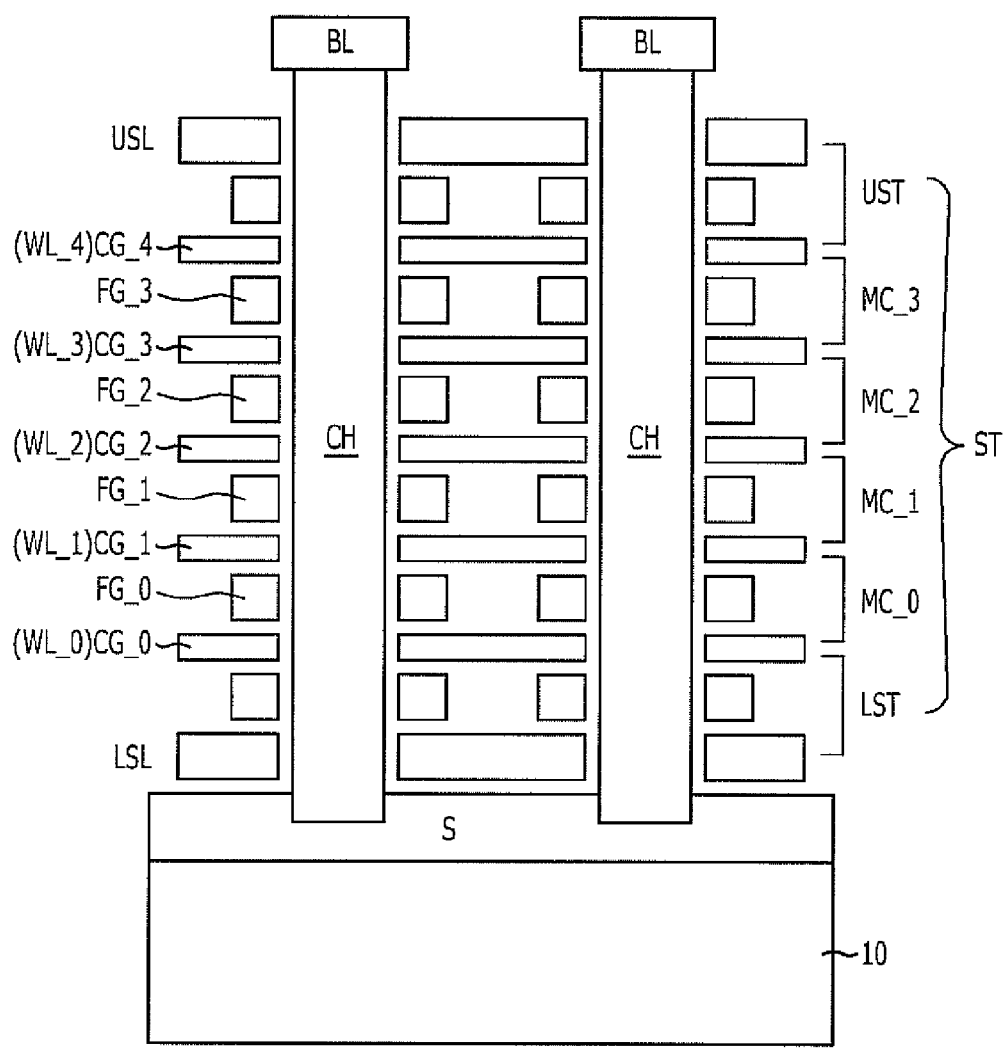
FIGS. 2A to 2C illustrate a structure of a vertical channel type non-volatile memory device in accordance with an exemplary embodiment of the present invention.
Figure 2B:
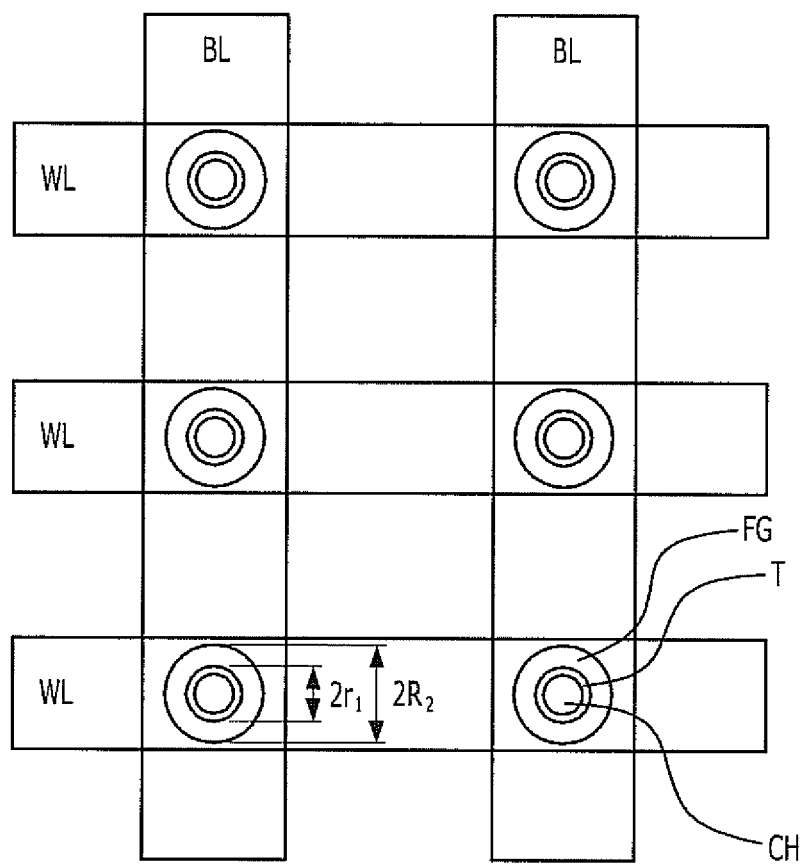
Figure 2C:
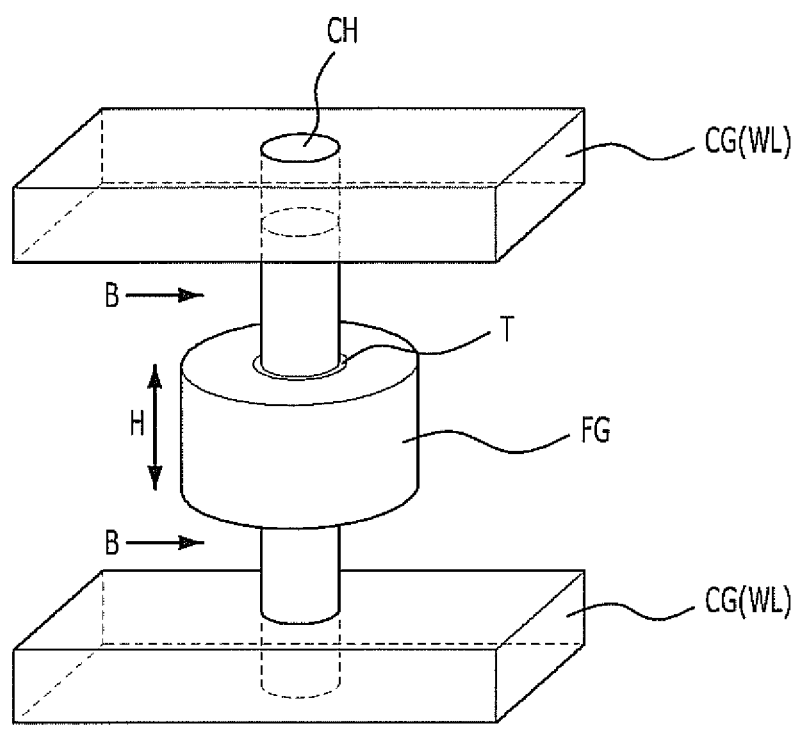

FIGS. 2A to 2C illustrate a structure of a vertical channel type non-volatile memory device in accordance with an exemplary embodiment of the present invention. For the sake of convenience in explanation, the vertical channel type non-volatile memory device is illustrated with a focus placed on channels CH, a floating gate electrode FG, a control gate electrode CG, and an insulation layer interposed between them is not shown in the drawing.

FIG. 2A is a cross-sectional view illustrating a vertical channel type non-volatile memory device in accordance with an exemplary embodiment of the present invention. As illustrated, the vertical channel type non-volatile memory device in accordance with an exemplary embodiment of the present invention includes a plurality of memory cells $MC\_0$ to $MC\_3$ stacked along channels CH protruded from a substrate with a source region S formed therein. Herein, the plurality of the memory cells $MC\_0$ to $MC\_3$ are coupled in series between a lower selection transistor LST and an upper selection transistor UST to thereby form a string ST. A plurality of strings ST are coupled with bit lines BL, respectively.

The structure of the memory cells MC will be described in detail hereafter. A tunnel insulation layer (not shown) is formed to surround the channels CH protruded from the substrate 10, and a plurality of floating gate electrodes FG and a plurality of control gate electrodes CG are alternately stacked along the channels CH. Also, a charge block layer (not shown) is interposed between the plurality of the floating gate electrodes FG and the plurality of the control gate electrodes CG to separate the plurality of the floating gate electrodes FG and the plurality of the control gate electrodes CG from each other.

Herein, each of the plurality of the memory cells MC includes one floating gate electrode FG and two control gate electrodes CG formed in the upper and lower portions of the floating gate electrode FG. For example, a memory cell $MC\_0$ includes a floating gate electrode $FG\_0$, a first control gate electrode $CG\_1$ formed in the upper portion of the floating gate electrode $FG\_0$, and a second control gate electrode $CG\_0$ formed in the lower portion of the floating gate electrode $FG\_0$.

Herein, adjacent memory cells MC share a control gate electrode CG. To take an example, a memory cell $MC\_1$ shares the control gate electrode $CG\_1$ with the memory cell $MC\_0$, and shares the control gate electrode $CG\_2$ with a memory cell $MC\_2$.

Because of such a structure, one memory cell MC is driven by two control gate electrodes CG. In other words, the memory cell MC is operated by applying input voltage to the control gate electrodes CG adjacent to the upper and lower portions of the floating gate electrode FG of the memory cell to be driven.

For example, the memory cell $MC\_0$ is driven as an input voltage is applied to the first control gate electrode $CG\_1$ and the second control gate electrode $CG\_0$ which are adjacent to the upper and lower portions of the floating gate electrode $FG\_0$. Particularly, the floating gate electrode $FG\_0$ is driven by the first control gate electrode $CG\_1$ and the second control gate electrode $CG\_0$. Hereafter, the operation of a memory device having the above-described structure will be described.

First, a program operation will be described. A non-volatile memory device performs a program operation on a page basis. In this disclosure, a case of performing a program operation in one memory cell MC will be described for the sake of convenience in explanation.

A floating gate type non-volatile memory device injects charges of a channel CH into a floating gate electrode FG through Fouler-Nordheim tunneling (F-N tunneling) during a program operation. In other words, a data is stored as charges are stored in a conduction band of a floating gate electrode FG.

According to an exemplary embodiment of the present invention, one memory cell MC includes two control gate electrodes CG. By way of example, a program voltage $V_{PGM}$ is applied to the first control gate electrode CG_3 or the second control gate electrode CG_2 which are adjacent to the upper or lower portion of the floating gate electrode FG_2 of a memory cell MC_2 which is to perform a program operation, that is, to a word line WL_3 or a word line WL_2 of a page including the memory cell MC_2 which is to perform a program operation.

Herein, the program voltage $V_{PGM}$ may be applied to only one of the control gate electrodes CG_3 and CG_2, or the program voltage $V_{PGM}$ may be applied to both control gate electrodes CG_3 and CG_2. Also, when the program voltage $V_{PGM}$ is applied to both control gate electrodes CG_3 and CG_2, it is possible to apply a program voltage $V_{PGM}$ of the same level or a program voltage $V_{PGM}$ of different levels. Herein, the program voltage $V_{PGM}$ may range from approximately 15 V to approximately 25 V.

Also, a pass voltage $V_{PASS}$ is applied to the control gate electrodes CG of memory cells MC_0, MC_1 and MC_3 which do not perform the program operation, that is, the pass voltage $V_{PASS}$ is applied to the word lines WL of a page for which the program operation is not performed. The pass voltage $V_{PASS}$ may range from approximately 2 V to approximately 10 V.

Also, a voltage of approximately 4.5 V may be applied to an upper selection line USL, and a ground voltage may be applied to a lower selection line LSL, while a voltage $V_{CC}$ may be applied to a source region S.

Furthermore, the ground voltage may be applied to a bit line BL coupled with the selected memory cell MC_2, and the voltage $V_{CC}$ may be applied to other bit lines BL.

Second, a case of performing an erase operation according to an exemplary embodiment will be described hereafter. A non-volatile memory device performs an erase operation on a block-by-block basis. In this exemplary embodiment, a case where a program operation is performed for one memory cell MC is described for the sake of convenience in explanation.

A floating gate type non-volatile memory device erases a data by discharging to a channel CH charges stored in the conductive band of a floating gate electrode FG through the F-N tunneling.

According to an exemplary embodiment of the present invention, one memory cell MC includes two control gate electrodes CG. By way of example, an erase voltage $V_{ERASE}$ is applied to the first control gate electrode CG_3 or the second control gate electrode CG_2 neighboring the upper or lower portion of the floating gate electrode FG_2 of the memory cell MC_2 which is to perform the erase operation, that is, the erase voltage $V_{ERASE}$ is applied to selected ones of word lines WL_0 to WL_4 of a memory block for which the erase operation is to be performed.

Herein, the erase voltage $V_{ERASE}$ may be applied to only one of the control gate electrodes CG_3 and CG_2, or it may be applied to both two control gate electrodes CG_3 and CG_2. When the erase voltage $V_{ERASE}$ is applied to both of the control gate electrodes CG_3 and CG_2, an erase voltage $V_{ERASE}$ of the same level may be applied or an erase voltage $V_{ERASE}$ of different levels may be applied. Herein, the erase voltage $V_{ERASE}$ may range from approximately $-15$ V to approximately $-25$ V.

Also, a voltage of approximately 4.5 V may be applied to an upper selection line USL and a lower selection line LSL, and a ground voltage may be applied to a source region S and bit lines BL.

Third, a case of performing a read operation according to an exemplary embodiment will be described. A non-volatile memory device performs a read operation on a page basis. In this explanation of an exemplary embodiment, a case where a read operation that is performed for one memory cell MC is described for the sake of convenience.

A floating gate type non-volatile memory device reads a data stored in a memory cell MC based on the difference of threshold values between a memory cell MC with a data '1' stored (erased) therein and a memory cell MC with a data '0' stored (programmed) therein.

According to another exemplary embodiment of the present invention, one memory cell MC includes two control gate electrodes CG.

By way of example, a read voltage $V_{READ}$ is applied to the first control gate electrode CG_3 or the second control gate electrode CG_2 neighboring the upper or lower portion of the floating gate electrode FG_2 of the memory cell MC_2 which is to perform the read operation, that is, the read voltage $V_{READ}$ is applied to a word line WL_3 or a word line WL_2 of a page including the memory cell MC_2 for which the read operation is to be performed.

Herein, the read voltage $V_{READ}$ may be applied to only one of the control gate electrodes CG_3 and CG_2 or it may be applied to both of the control gate electrodes CG_3 and CG_2. When the read voltage $V_{READ}$ is applied to both control gate electrodes CG_3 and CG_2, a read voltage $V_{READ}$ of the same level may be applied or a read voltage $V_{READ}$ of different levels may be applied. Herein, the read voltage $V_{READ}$ may range from approximately $-5$ V to approximately 5 V.

Also, a turn-on voltage is applied to the control gate electrodes CG of memory cells MC_0, MC_1 and MC_3 that do not perform the read operation, that is, the turn-on voltage is applied to word lines WL_0, WL_1, and WL_4 of a page for which the read operation is not performed. Herein, the turn-on voltage is a voltage for turning on a memory cell MC regardless of whether the memory cell MC is programmed or not. The turn-on voltage may be approximately 5 V.

Also, a voltage of approximately 4.5 V may be applied to an upper selection line USL and a lower selection line LSL, and a ground voltage may be applied to a source region S, while a voltage of approximately 1 V may be applied to a bit line BL.

FIGS. 2B and 2C illustrate a memory cell structure of a vertical channel type non-volatile memory device in accordance with an exemplary embodiment of the present invention. FIG. 2B is a plan view of the memory device, and FIG. 2C is a perspective view of the memory cell structure.

As illustrated in the drawings, memory cells MC are formed in the regions where bit lines BL and word lines WL crosses each other. A memory cell MC includes a channel CH, a tunnel insulation layer T surrounding the channel CH, a plurality of floating gate electrodes FG and a plurality of control gate electrodes CG stacked along the channel CH, and a charge blocking layer B interposed between the plurality of the floating gate electrodes FG and the plurality of the control gate electrodes CG. In other words, the memory cell MC has one floating gate electrode FG sharing two control gate electrodes CG adjacent to its upper and lower portions.

The coupling ratio of the vertical channel type non-volatile memory device having the aforementioned structure may be calculated based on the equation below. Herein, the capacitance between the control gate electrode CG and the floating gate electrode FG is doubled during the calculation of the coupling ratio, because a floating gate electrode FG shares two control gate electrodes CG adjacent to the upper and lower portion of the floating gate electrode FG in the vertical channel type non-volatile memory device according to an exemplary embodiment of the present invention.

$$\text{Coupling Ratio } (CR) = \frac{2C_B}{2C_B + C_T}$$

$$C_B = \frac{\varepsilon S}{t_B} = \frac{\varepsilon^* \pi^* (R_2^* R_2 - R_1^* R_1)}{tB}$$

$$C_T = \frac{\varepsilon S}{t_T} = \frac{\varepsilon^* 2r\pi^* H}{tT}$$

where $t_T$ denotes the thickness of the tunnel insulation layer T; $t_B$ denotes the thickness of the charge blocking layer B; H denotes the height of the floating gate electrode FG; $R_1$ denotes the radius of the tunnel insulation layer T; $R_2$ denotes the radius of the floating gate electrode FG; and S denotes an area.

For example, when $t_T$=8 nm; $t_B$=12 nm; H=60 nm; $R_1$=20 nm; $R_2$=50 nm, the coupling ratio becomes 0.538. Thus, the coupling ratio may be improved compared with a conventional vertical channel type non-volatile memory device having a charge trapping layer and eventually, the performance of the memory device may be improved.

FIGS. 3A to 3F are cross-sectional views illustrating a method for fabricating a vertical channel type non-volatile memory device in accordance with another exemplary embodiment of the present invention. For the sake of convenience, a description about a process of forming a lower selection transistor and an upper selection transistor is omitted, and the following description will be focused on a process of forming a plurality of memory cells.

Figure 3A:
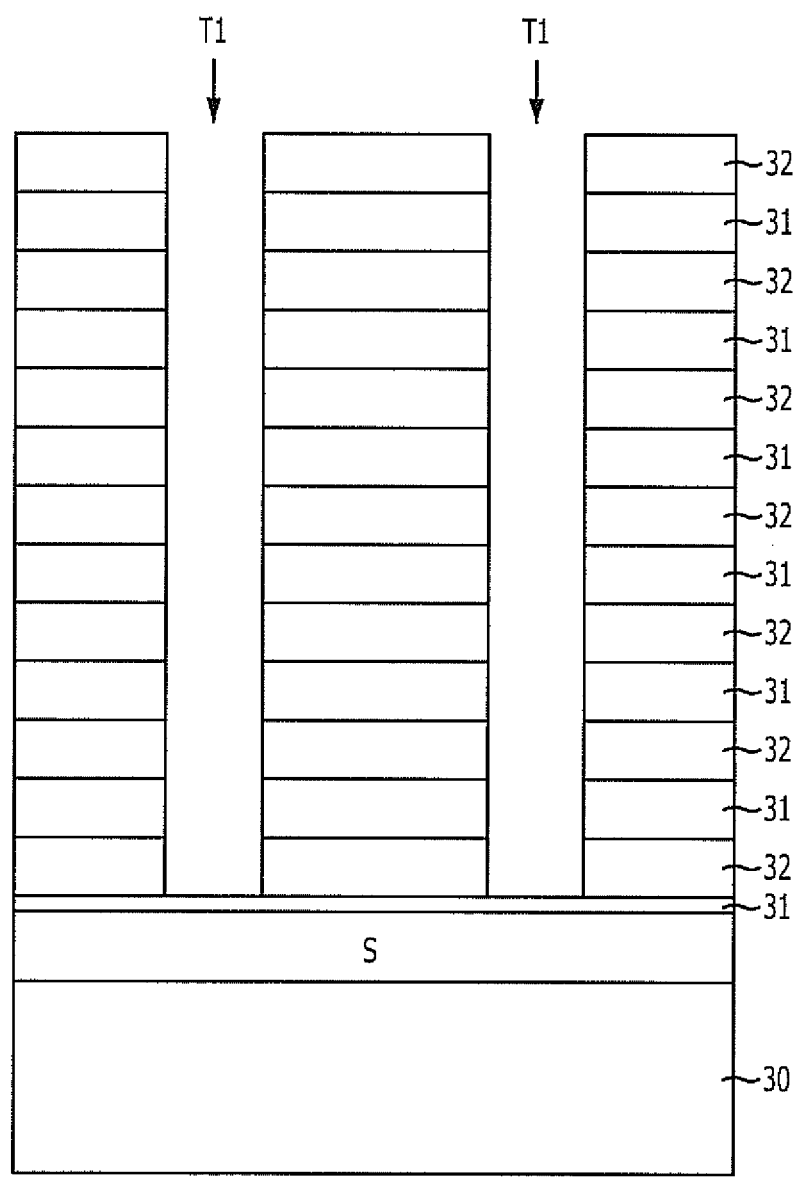
FIGS. 3A to 3F are cross-sectional views illustrating a method for fabricating a vertical channel type non-volatile memory device in accordance with another exemplary embodiment of the present invention.

Referring to FIG. 3A, a plurality of interlayer dielectric layers 31 and a plurality of sacrificial layers 32 are alternately formed over a substrate 30 with a source region S formed therein.

Herein, the interlayer dielectric layers 31 provide a region for forming floating gate electrodes in a subsequent process and separate control gate electrodes formed in the upper and lower portions of the floating gate electrodes. The sacrificial layers 32 secure space for forming a charge blocking layer and a control gate electrode in a subsequent process.

The number of the interlayer dielectric layers 31 and the sacrificial layers 32 to be stacked may be determined based on the number of memory cells MC to be stacked on the substrate 30. Also, although not illustrated in the drawing, interlayer dielectric layers and sacrificial layers for forming a lower selection transistor LST and an upper selection transistor UST may be formed thicker than the interlayer dielectric layers 31 and the sacrificial layers 32 for forming the memory cells.

Also, while the plurality of the interlayer dielectric layers 31 are maintained in a subsequent process, the space for forming the charge blocking layer and the control gate electrodes is acquired by selectively removing only the sacrificial layers 32. The sacrificial layers 32 may be formed of a material having a large selectivity with respect to the interlayer dielectric layers 31. In particular, the interlayer dielectric layers 31 may be formed of an oxide layer, e.g., a silicon dioxide ($SiO_2$) layer, and the sacrificial layers 32 may be formed of a carbon layer or a nitride layer, e.g., (SiN) layer.

Subsequently, the plurality of the interlayer dielectric layers 31 and the plurality of the sacrificial layers 32 are etched to thereby form trenches T1. Herein, the trenches T1 may be formed so deep as to expose all of the plurality of the interlayer dielectric layers 31 on its internal wall.

Figure 3B:
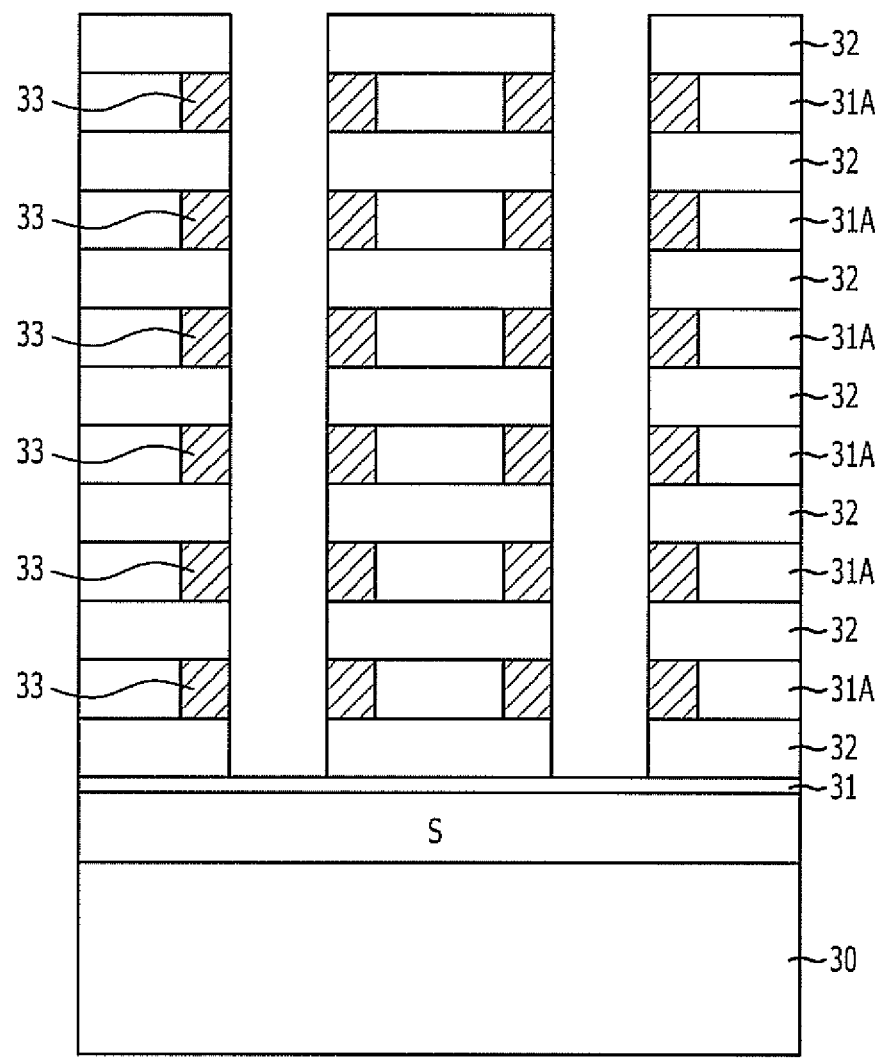

Referring to FIG. 3B, the plurality of the interlayer dielectric layers 31 exposed in the internal wall of the trenches T1 are recessed in a predetermined depth. The depth to be recessed may be determined based on the thickness of a floating gate electrode formed in a subsequent process. In this specification, the interlayer dielectric layers 31 recessed to the predetermined depth are marked with a reference numeral '31A' and referred to as recessed interlayer dielectric layer 31A.

Herein, the process of recessing the interlayer dielectric layers 31 to thereby form the recessed interlayer dielectric layer 31A may be performed through a wet etch process or an isotropic etch process.

Subsequently, a floating gate electrode 33 is formed by filling the recess regions of the recessed interlayer dielectric layer 31A with a conductive layer. Herein, the floating gate electrode 33 may be formed by filling the trenches with the recess regions with the conductive layer and performing an etch-back process onto the conductive layer.

Figure 3C:
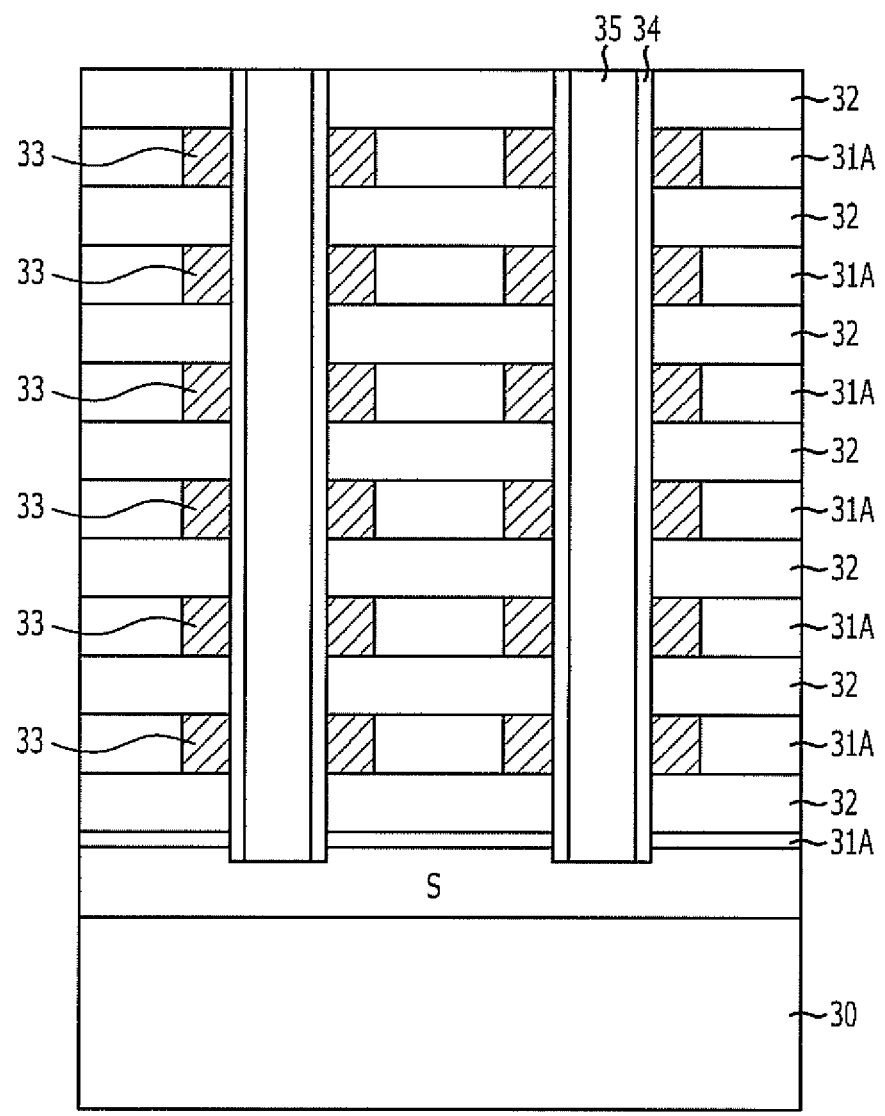

Referring to FIG. 3C, a tunnel insulation layer 34 is formed on the internal wall of the trenches before the formation of channels 35. Then, the channels 35 are formed by filling the trenches with a tunnel insulation layer 34 formed therein with a layer for channels. Herein, the layer for channels 35 may be a poly silicon layer.

Herein, the surface of the substrate 30 may be exposed in the lower portion of the trenches through the etch-back process after the tunnel insulation layer 34 is formed over the resultant structure with the floating gate electrode 33 formed therein.

Although not illustrated in the drawing, a protective layer may be formed over the tunnel insulation layer 34 to protect the tunnel insulation layer 34 from being damaged during the etch-back process. The protective layer may be formed of an oxide layer, a nitride layer, a carbon layer, or a poly silicon layer. For example, after the formation of the floating gate electrode 33, a material layer for a tunnel insulation layer is formed over the trenches. Subsequently, the tunnel insulation layer may be formed by forming the protective layer over the material layer for a tunnel insulation layer and performing the etch-back process onto the protective layer and the material layer for a tunnel insulation layer to expose the substrate 30 at the bottom of the trenches.

When the protective layer is formed in the process described above, the protective layer may be removed before the formation of the layer for channels. When the protective layer is formed of the same material as the layer for channels, the protective layer may not be removed and the layer for channels may be formed directly.

Figure 3D:
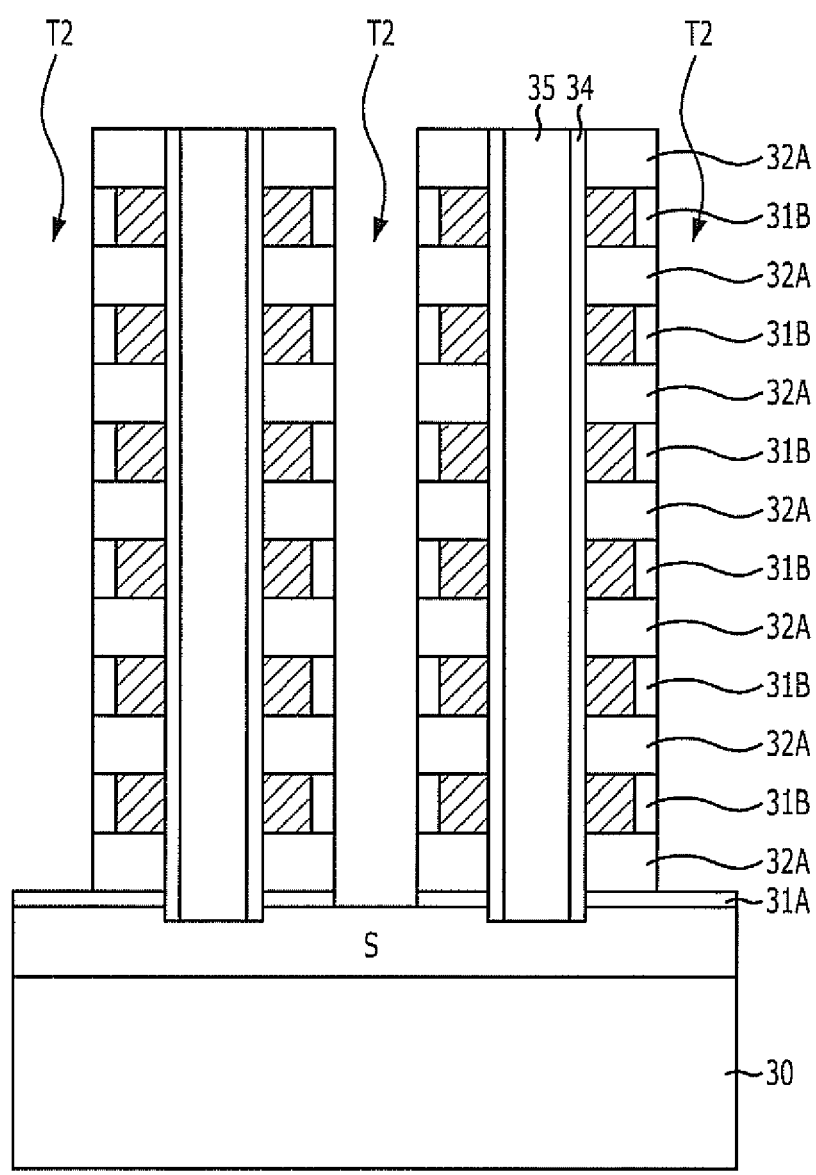

Referring to FIG. 3D, trenches T2 are formed by etching a plurality of the recessed interlayer dielectric layer 31A and the plurality of the sacrificial layers 32. In the drawings, the etched interlayer dielectric layer formed during the process of forming the trenches T2 are labeled with a reference numeral '31B.' The sacrificial layers 32 are labeled with a reference numeral '32A' and referred to as etched sacrificial layer 32A.

Through the trenches T2 formation process, control gate electrodes to be formed through a subsequent process, that is, word lines, can be patterned. Herein, the trenches T2 may be formed so deep as to expose all of the plurality of the sacrificial layers 32 shown in the internal wall.

Figure 3E:
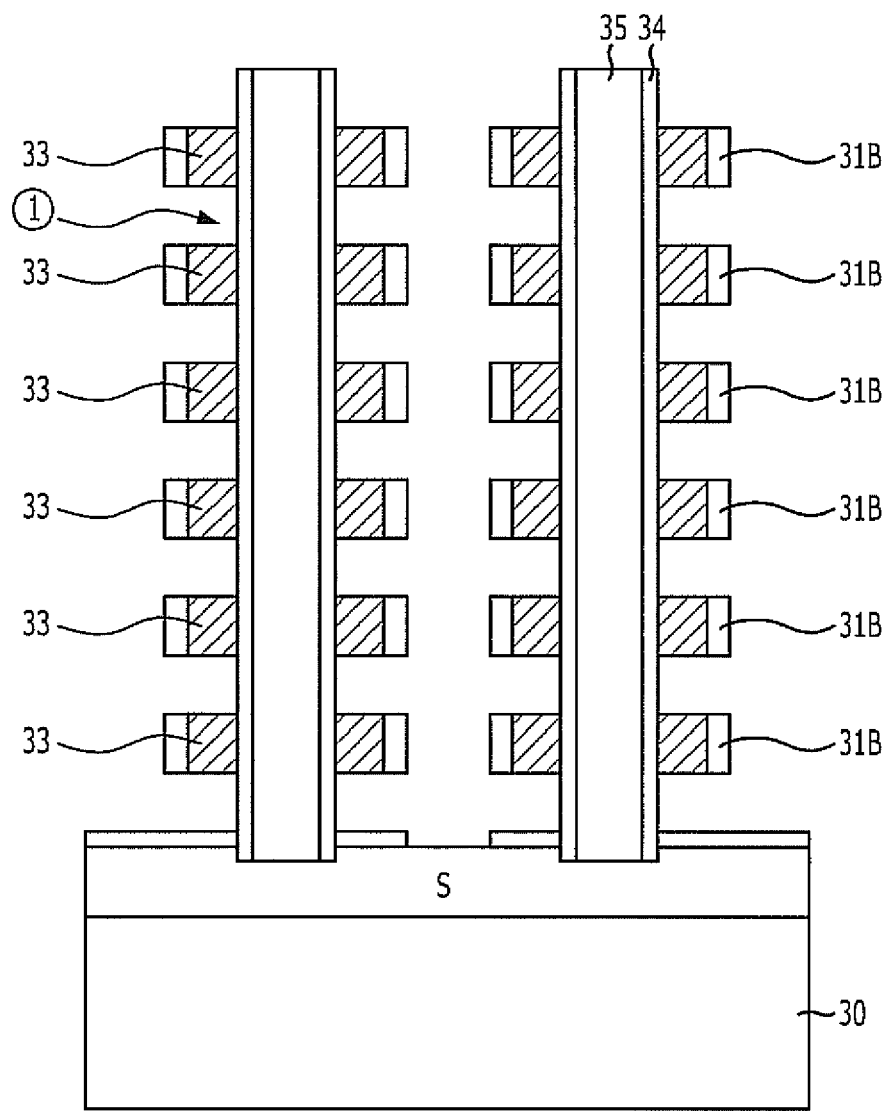

Referring to FIG. 3E, regions for forming the charge blocking layer and the control gate electrodes between the plurality of the floating gate electrodes 33 are opened (see reference symbol ①) by removing the sacrificial layer patterns 32A exposed through the internal wall of the trenches T2.

Figure 3F:
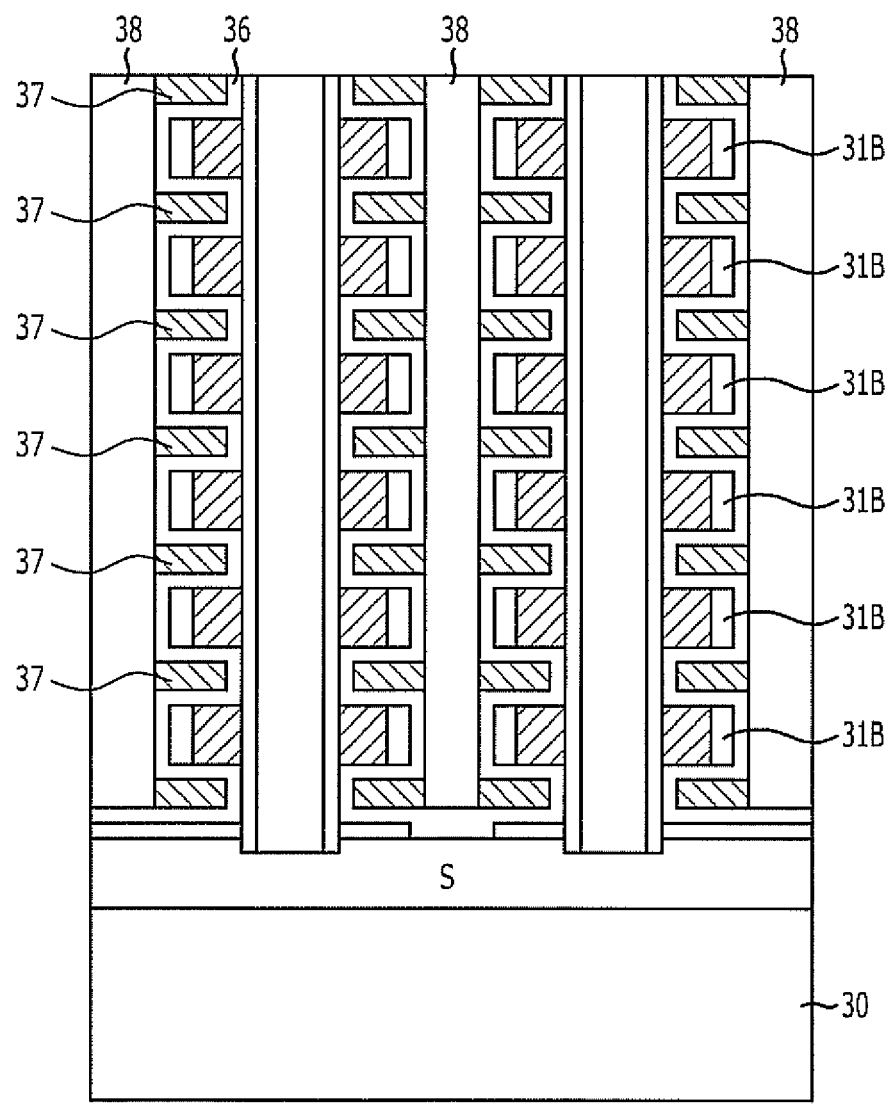

Referring to FIG. 3F, a charge blocking layer 36 is formed over the resultant structure without the etched sacrificial layer 32A. The charge blocking layer 36 is formed to surround the entire surface of the floating gate electrode 33 and the structure leads to a reduced interference between adjacent memory cells. As a result, the charge blocking layer 36 is formed in a portion of the opened region ① acquired by removing the etched sacrificial layer 32A.

Subsequently, the remainder of the opened region with the charge blocking layer 36 formed therein is filled with a conductive layer to thereby form control gate electrodes 37. Essentially, the control gate electrodes 37 are formed by filling a conductive layer in the remainder of the opened region ① around the charge blocking layer 36.

Herein, the control gate electrode 37 may be formed by filling the trenches T2 including the opened region ① with the conductive layer and performing the etch-back process onto the conductive layer.

Subsequently, the trenches of the resultant structure with the control gate electrode 37 formed therein are filled with an insulation layer 38. Then, although not illustrated in the drawing, a subsequent process of forming bit lines coupled with the channels 35, respectively, is performed.

According to an exemplary embodiment of the present invention, a floating gate type non-volatile memory device having a three dimensional structure may be easily fabricated. Particularly, memory cells including floating gate electrodes driven by two control gate electrodes may be fabricated by filling the regions without the etched sacrificial layer 32A with the conductive layer and forming two control gate electrodes 37 in the upper and lower portions of the floating gate electrode 33.

Also, since the charge blocking layer 36 is formed to surround the entire surface of the floating gate electrode 33, the interference between the memory cells may be reduced, compared with the amount of interference induced in a conventional technology.

Figure 4A:
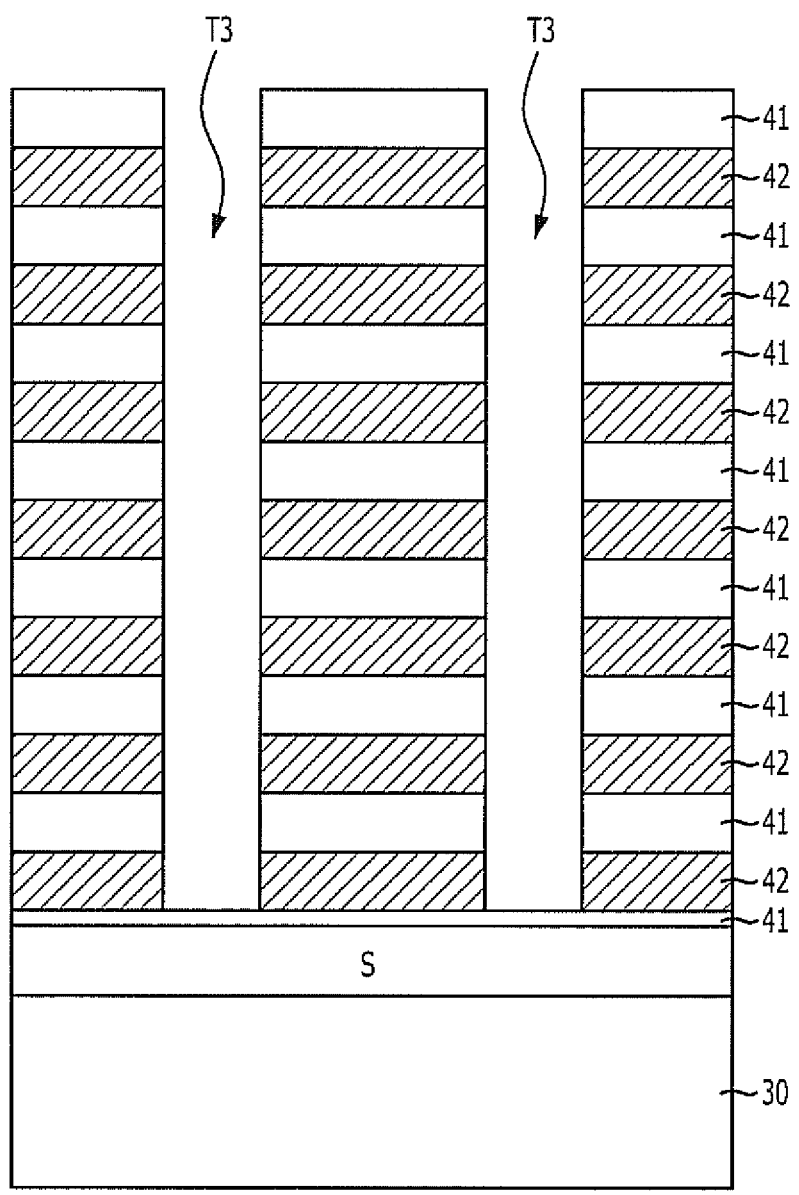
FIGS. 4A to 4D are cross-sectional views illustrating a method for fabricating a vertical channel type non-volatile memory device in accordance with another exemplary embodiment of the present invention.

FIGS. 4A to 4D are cross-sectional views illustrating a method for fabricating a vertical channel type non-volatile memory device in accordance with another exemplary embodiment of the present invention. Referring to FIG. 4A, a plurality of interlayer dielectric layers 41 and a plurality of conductive layers 42 for a control gate electrode are alternately formed over a substrate 40.

Herein, the number of the interlayer dielectric layers 41 and the conductive layers 42 for a control gate electrode to be stacked may be determined in consideration of the number of memory cells to be stacked over the substrate 40. Also, although not illustrated in the drawing, interlayer dielectric layers and conductive layers for a control gate electrode for forming a lower selection transistor LST and an upper selection transistor UST may be formed thicker than the interlayer dielectric layers 41 and the conductive layers 42 for a control gate electrode for forming memory cells.

Also, the interlayer dielectric layers 41 may be an insulation layer. For example, the interlayer dielectric layers 41 may be formed of an oxide layer. However, the uppermost interlayer dielectric layer 41 may be a nitride layer since it functions as a hard mask layer.

Subsequently, trenches T3 are formed by etching the plurality of the interlayer dielectric layers 41 and the plurality of the interlayer dielectric layers 41. The trenches T3 are formed so deep as to expose all of the plurality of the interlayer dielectric layers 41 through their internal wall.

Figure 4B:
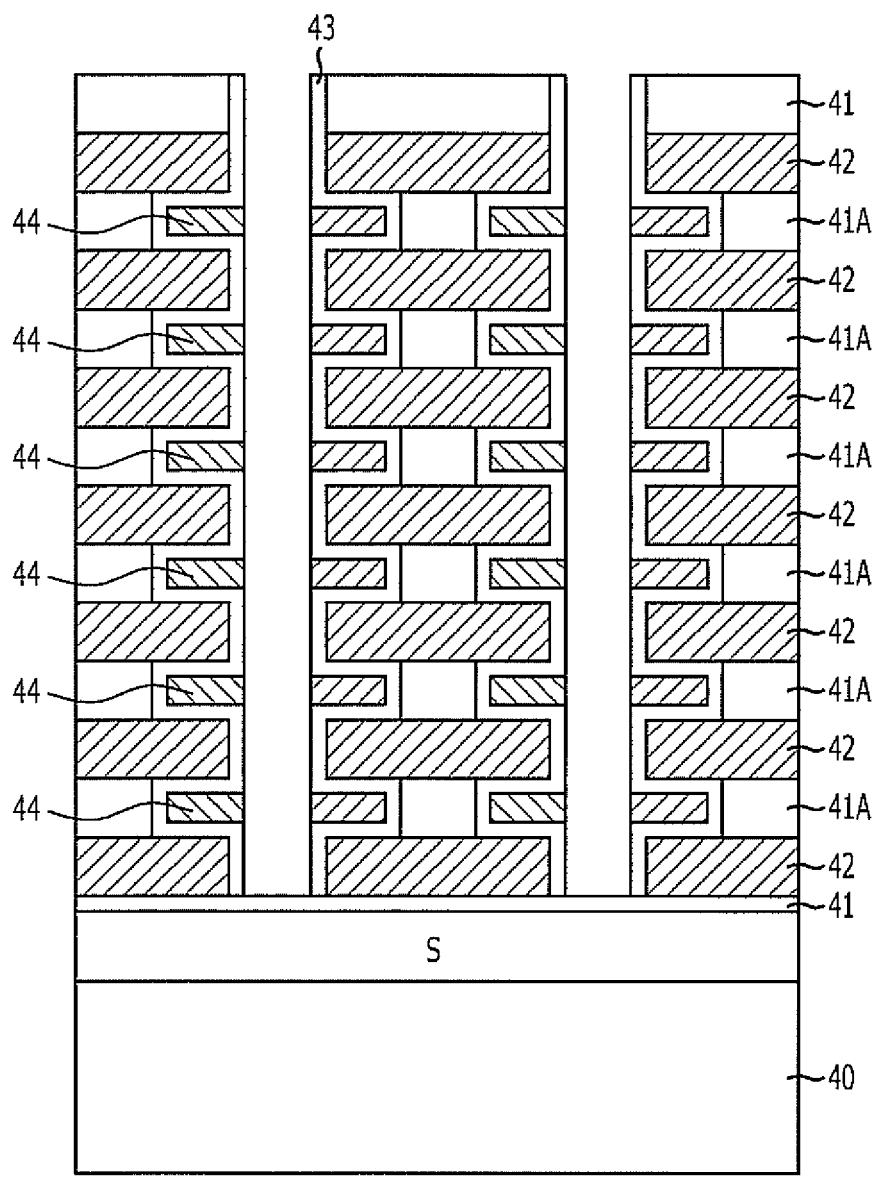

Referring to FIG. 4B, the plurality of the interlayer dielectric layers 41 exposed through the internal walls of the trenches T3 are recessed in a predetermined depth. The recess depth may be determined in consideration of the thicknesses of a charge blocking layer and the floating gate electrodes.

Through this process, regions for forming the charge blocking layer and the floating gate electrodes in a subsequent process are opened. In the drawing, the interlayer dielectric layers recessed in a predetermined depth are marked with a reference numeral '41A' and referred to as recessed interlayer dielectric layer 41A.

Herein, the process of recessing the interlayer dielectric layers 41 to thereby form the recessed interlayer dielectric layer 41A may be performed through a wet etch process or an isotropic etch process. However, the uppermost interlayer dielectric layer 41, which is formed of a nitride layer, is not recessed.

Subsequently, a charge blocking layer 43 is formed over the resultant structure with the recessed interlayer dielectric layer 41A formed therein. As a result, the charge blocking layer 43 is formed in a portion of the opened regions obtained from the recessing process of the interlayer dielectric layer 41.

Subsequently, floating gate electrodes 44 are formed to be adjacent to the upper and lower portions of control gate electrodes. Herein, the floating gate electrodes 44 may be formed by filling the trenches T3 having the opened regions with the blocking layer 43 with a conductive layer and performing an etch-back process onto the conductive layer.

Through this process, the floating gate electrodes 44 surrounded by the charge blocking layer 43 are formed.

Figure 4C:
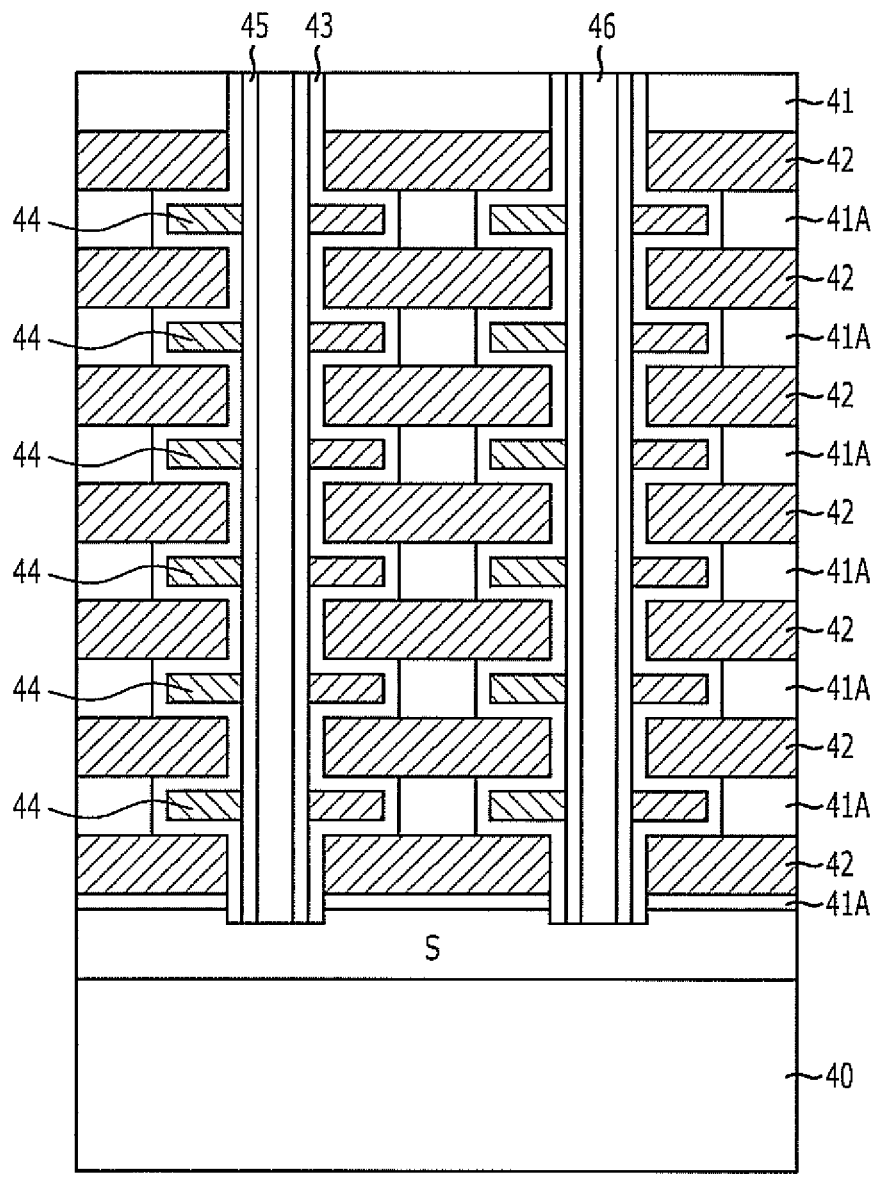

Referring to FIG. 4C, a tunnel insulation layer 45 is formed on the internal wall of the trenches before the formation of channels 46. In other words, after the tunnel insulation layer 45 is formed on the internal wall of the trenches T3 with the floating gate electrodes 44 formed therein, the channels 46 are formed by filling the trenches with the tunnel insulation layer 45 formed therein with a layer for channels. Herein, the layer for channels may be a poly silicon layer.

Herein, the surface of the substrate 40 may be exposed at the bottom of the trenches T3 through an etch-back process, after the tunnel insulation layer 45 is formed over the resultant structure with the floating gate electrodes 44.

Although not illustrated in the drawing, a protective layer may be additionally formed over the tunnel insulation layer 45 in order to protect the tunnel insulation layer 45 from being damaged from the etch-back process. The protective layer may be formed of an oxide, a nitride, a carbon layer, or a poly silicon layer. For example, after the formation of the floating gate electrodes 44, a material layer for a tunnel insulation layer is formed over the trenches T3. The tunnel insulation layer may be formed by forming the protective layer over the material layer for a tunnel electrode layer and then performing an etch-back process onto the protective layer and the material layer for a tunnel insulation layer.

When the protective layer is formed, the protective layer may be removed before the trenches T3 are filled with the layer for channels. However, when the protective layer is formed of the same material as the layer for channels, the protective layer is not removed and the trenches T3 are filled with the layer for channels directly.

Figure 4D:
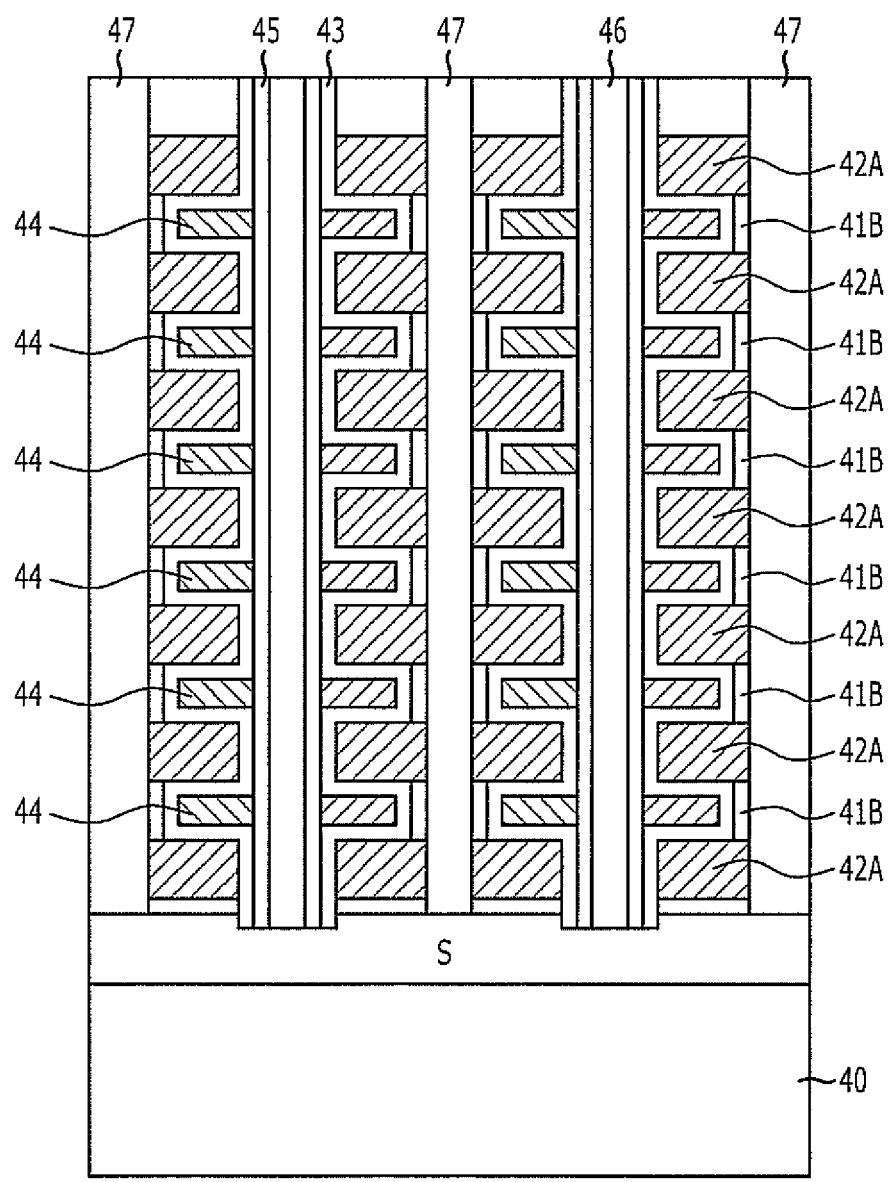

Referring to FIG. 4D, the trenches T3 are formed by etching the plurality of the recessed interlayer dielectric layers 41A and the plurality of the conductive layers 42 for a control gate electrode and then the trenches T3 are filled with an insulation layer 47.

As described above, control gate electrodes 42A of the plurality of the memory cells may be formed by patterning the conductive layer 42 for a control gate electrode to thereby separate them one from another. In other words, word lines may be patterned. In the drawing, etched interlayer dielectric layers during the formation of the trenches T3 are marked with a reference numeral '41B' and referred to as etched interlayer dielectric layer 41B.

The technology according to one embodiment of the present invention provides a floating gate type non-volatile memory device having a three-dimensional structure that can be easily fabricated. Particularly, the technology according to one embodiment of the present invention provides a vertical channel type non-volatile memory device including first and second control gate electrodes 42A in the upper and lower portions of the floating gate electrodes 44 by alternately forming a plurality of interlayer dielectric layers and a plurality of control gate electrodes and then filling recess regions, which are acquired by recessing the interlayer dielectric layers by a predetermined depth, with a conductive layer. In other words, the technology according to another exemplary embodiment of the present invention provides a floating gate type non-volatile memory device of a three-dimensional structure including memory cells with floating gate electrodes each of which is driven by two control gate electrodes.

Also, since the charge blocking layer 43 is formed to surround the floating gate electrodes 44, the interference between the memory cells may be reduced compared with the interference occurring in a conventional technology.

Another exemplary embodiment of the present invention provides a floating gate type non-volatile memory device. In particular, first and second control gate electrodes are formed in the upper and lower portions of a floating gate electrode. With the two control gate electrodes in one memory cell, memory cells may be easily driven.

Also, with a charge blocking layer formed to surround the entire surface of the floating gate electrode, it is possible to reduce interference, compared to conventional technology.

While the present invention has been described with respect to exemplary embodiments, it will be apparent to those skilled in the art that various changes and modifications may be made without departing from the spirit and scope of the invention as defined in the following claims.

What is claimed is:

1. A vertical channel type non-volatile memory device having a plurality of memory cells stacked along a channel, comprising:
    the channel configured to be protruded from a substrate;
    a tunnel insulation layer configured to surround the channel;
    a plurality of floating gate electrodes and a plurality of control gate electrodes alternately stacked along the channel, wherein
    a control gate electrode, of the plurality of control gate electrodes, is disposed between each adjacent pair of floating gate electrodes, of the plurality of floating gate electrode; and
    a charge blocking layer interposed between each floating gate electrode, of the plurality of the floating gate electrodes, and each control gate electrode of the plurality of the control gate electrodes.

2. The vertical channel type non-volatile memory device of claim 1, wherein the charge blocking layer surrounds the floating gate electrodes.

3. The vertical channel type non-volatile memory device of claim 1, wherein in the memory cells,
    one floating gate electrode shares two adjacent control gate electrodes.

4. The vertical channel type non-volatile memory device of claim 1, wherein, for each floating gate electrode of the plurality of floating gate electrodes, two control gate electrodes that are adjacent to the floating gate electrode on different sides of the floating gate electrode are configured to receive a program voltage in order to perform a program operation.

5. The vertical channel type non-volatile memory device of claim 1, wherein, for each floating gate electrode of the plurality of floating gate electrodes, two control gate electrodes that are adjacent to the floating gate electrode on different sides of the floating gate electrode are configured to receive an erase voltage in order to perform an erase operation.

6. The vertical channel type non-volatile memory device of claim 1, wherein, for each floating gate electrode of the plurality of floating gate electrodes, two control gate electrodes that are adjacent to the floating gate electrode on different sides of the floating gate electrode are configured to receive a read voltage in order to perform a read operation.

* * * * *